US007851234B2

United States Patent
Ko et al.

(10) Patent No.: US 7,851,234 B2
(45) Date of Patent: Dec. 14, 2010

(54) SYSTEM AND METHOD FOR ENHANCED CONTROL OF COPPER TRENCH SHEET RESISTANCE UNIFORMITY

(75) Inventors: Francis Ko, Taichung (TW); Jean Wang, Hsin Chu (TW); Henry Lo, Hsinchu (TW); Chi-Chun Hsieh, Tongluo Township (TW); Amy Wang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 299 days.

(21) Appl. No.: 11/947,380

(22) Filed: Nov. 29, 2007

(65) Prior Publication Data
US 2009/0142860 A1    Jun. 4, 2009

(51) Int. Cl.
*G06F 19/00* (2006.01)
(52) U.S. Cl. .......................................... 438/10; 438/15
(58) Field of Classification Search ................ 438/934, 438/10; 257/E21.525
See application file for complete search history.

(56) References Cited

U.S. PATENT DOCUMENTS

| | | | |
|---|---|---|---|
| 5,913,102 A | 6/1999 | Yang | |
| 6,054,868 A | 4/2000 | Borden et al. | |
| 6,118,533 A * | 9/2000 | Banet et al. .................. | 356/450 |
| 6,191,602 B1 | 2/2001 | Huang-Lu et al. | |
| 6,594,542 B1 | 7/2003 | Williams | |
| 6,756,309 B1 | 6/2004 | Chen et al. | |
| 6,770,852 B1 | 8/2004 | Steger | |
| 6,776,692 B1 | 8/2004 | Zuniga et al. | |
| 6,854,100 B1 | 2/2005 | Chuang et al. | |
| 6,877,152 B2 | 4/2005 | Gau et al. | |
| 6,884,147 B2 | 4/2005 | Toprac | |
| 6,929,962 B1 | 8/2005 | Chang | |
| 7,024,268 B1 | 4/2006 | Bennett et al. | |
| 7,083,495 B2 * | 8/2006 | Lin et al. ....................... | 451/5 |
| 7,112,960 B2 | 9/2006 | Miller et al. | |
| 7,118,451 B2 | 10/2006 | Chen et al. | |
| 7,133,788 B2 | 11/2006 | Shen et al. | |
| 7,220,677 B2 | 5/2007 | Li et al. | |
| 7,421,358 B2 * | 9/2008 | Tuohy ......................... | 702/81 |
| 2003/0116854 A1 * | 6/2003 | Ito et al. ....................... | 257/761 |
| 2005/0167397 A1 | 8/2005 | Chen et al. | |
| 2006/0262287 A1 | 11/2006 | Hiar et al. | |

* cited by examiner

*Primary Examiner*—Thanh V Pham
*Assistant Examiner*—Mohammad Choudhry
(74) *Attorney, Agent, or Firm*—Duane Morris LLP

(57) ABSTRACT

A method is disclosed for controlling the sheet resistance of copper trenches formed on semiconductor wafers. The method includes forming a plurality of copper-filled trenches on a wafer, measuring the sheet resistance of each of the plurality of copper-filled trenches, and comparing the measured sheet resistance values to a predetermined sheet resistance value. Photolithography steps performed on subsequent wafers are adjusted according to a difference between the measured sheet resistance values and the predetermined value. In one embodiment, this adjustment takes the form of adjusting a photolithographic extension exposure energy to thereby adjust the cross-section of the resulting trenches.

14 Claims, 6 Drawing Sheets

SYSTEM AND METHOD FOR ENHANCED CONTROL OF COPPER TRENCH SHEET RESISTANCE UNIFORMITY

FIELD OF THE INVENTION

The present invention relates generally to a system and method for controlling sheet resistance uniformity in copper lines, and more particularly to a system and method for enhanced control of sheet resistance uniformity in copper trench lines in semiconductor devices.

BACKGROUND OF THE INVENTION

In semiconductor fabrication integrated circuits and semiconductor devices are formed by sequentially forming semiconductor device features (structures) in sequential layers of material in a bottom-up manufacturing method. In order to form reliable devices, close tolerances are required in forming features, for example metal lines, to achieve precise control of the electrical resistance. Such electrical resistance is frequently measured as a sheet resistance (Rs) of the metal lines.

Often prior art processes rely on CMP (Chemical Mechanical Planarization) methods to control final metal line thickness, which in turn directly affects sheet resistance uniformity. For example, in a damascene metallization process, one or more dielectric insulating layers are formed, followed by anisotropic etching to define a trench opening in the dielectric insulating layer. Following formation of the trench, metal is deposited to fill the trench opening and form the metal line. A CMP process is then performed to planarize the upper surface of the process wafer and to define the final dimension of the line.

In forming metal lines, which also are often referred to as conductive interconnections, copper is increasingly used. Copper has low resistivity and good electromigration resistance as compared to other traditional interconnect metals such as aluminum. As device sizes decrease ever further, it is becoming more important to precisely control the width and depth of the metal lines in order to precisely control the resistance of the metal lines.

As previously noted, in many current processes the final thickness of the metal lines was controlled by controlling CMP polishing times that were determined from expected results based on previous model processes. If process deviations unexpectedly contribute to a less than desirable metal line thickness (i.e., sheet resistance), there is little that can be done to correct the problem especially if the CMP process has removed an excessive amount of the metal line.

Prior art attempts at controlling deviations have employed CMP devices having "multi-zone" heads, which are designed to remove material at different rates across a single wafer. Still, these CMP techniques have not been effective for use with copper line structures, in part because copper-CMP involves substantial chemical removal of material as compared to the more traditional mechanical removal of material experienced with other metal materials. Thus, sheet resistance can vary widely within a single wafer, as illustrated in FIG. 1, in which the X and Y axes represent wafer test sites, and the Z axis represents Copper sheet resistance. As can be seen, the sheet resistance of the copper trenches measured at different locations on a single wafer may be widely varying.

Thus, there remains a need in the semiconductor art for an improved system and method for achieving improved metal line electrical resistance precision, and for providing greater control over the final sheet resistance of copper-filled trenches.

SUMMARY OF THE INVENTION

To solve the aforementioned problem, a method is disclosed for enhancing sheet resistance uniformity in copper trenches.

A method of controlling uniformity of sheet resistance of a conductive material trench, comprising the steps of: providing a first semiconductor wafer having a first structure disposed thereon; performing a first photolithography step to dispose a pattern on an upper surface of said first structure; performing a first etching step to form a first trench in the first structure; depositing a first layer of conductive material within the first trench to form a first conductive material trench; measuring a sheet resistance of the first conductive material trench; comparing the sheet resistance of the first conductive material trench to a predetermined sheet resistance value to obtain a first comparison value; providing a second semiconductor wafer having a second structure disposed thereon; and performing a second photolithography step to dispose a pattern on an upper surface of said second structure; wherein the second photolithography step comprises adjusting an extension exposure energy value for said second photolithography step based on said first comparison value.

A method of controlling sheet resistance uniformity in a copper filled trench is disclosed, comprising the steps of: providing a plurality of copper filled trenches on a first wafer; measuring individual sheet resistance of each of the plurality of copper filled trenches; comparing the individual sheet resistance measurements to a predetermined sheet resistance value to obtain a sheet resistance uniformity map of the first wafer; providing a second semiconductor wafer having a dielectric layer disposed thereon; performing a photolithography step to dispose a pattern on an upper surface of said dielectric layer; wherein the photolithography step comprises adjusting an extension exposure energy value for the photolithography step based on said sheet resistance uniformity map of the first wafer.

A system for controlling sheet resistance uniformity in a copper filled trench is also disclosed. The system may comprise means for providing a plurality of copper filled trenches on a first wafer, means for measuring individual sheet resistance of each of a plurality of copper filled trenches, means for comparing the individual sheet resistance measurements to a predetermined sheet resistance value to obtain a sheet resistance uniformity map of the first wafer, means for performing a photolithography step to dispose a pattern on an upper surface of a dielectric layer on a second wafer, and means for adjusting an extension exposure energy value for said photolithography step based on the sheet resistance uniformity map of the first wafer.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts, and further wherein.

DETAILED DESCRIPTION

Although the disclosure relates to implementation in copper filled structures, it will be appreciated that the it is equally applicable to the formation of other metal filled structures. It will be further appreciated that the disclosed method is envisioned to be used multiple times in the manufacture of a multi-level semiconductor device and that the particular semiconductor manufacturing processes set forth herein are intended to exemplify the practice of the method. It will be also understood that the use of the term "copper" herein includes copper or alloys thereof. Further, it will be appreciated that the disclosure is not necessarily limited to copper filled trenches, but may also be applied to the fabrication of semiconductor structures comprised of other metals, such as Aluminum alloys, Aluminum, Tungsten, and the like.

In one embodiment a method is disclosed for enhancing uniformity of the sheet resistance of copper trenches. Advantages of the method are an increase by more than 50% of within-wafer (WIW) copper sheet resistance uniformity as compared to previous methods. In its most general form, the method utilizes a measured sheet resistance pattern of a wafer to adjust the lithography after-develop-inspection (ADI) extension exposure patterning to compensate for trench geometry variations identified by the measured sheet resistance pattern.

Figure 1:
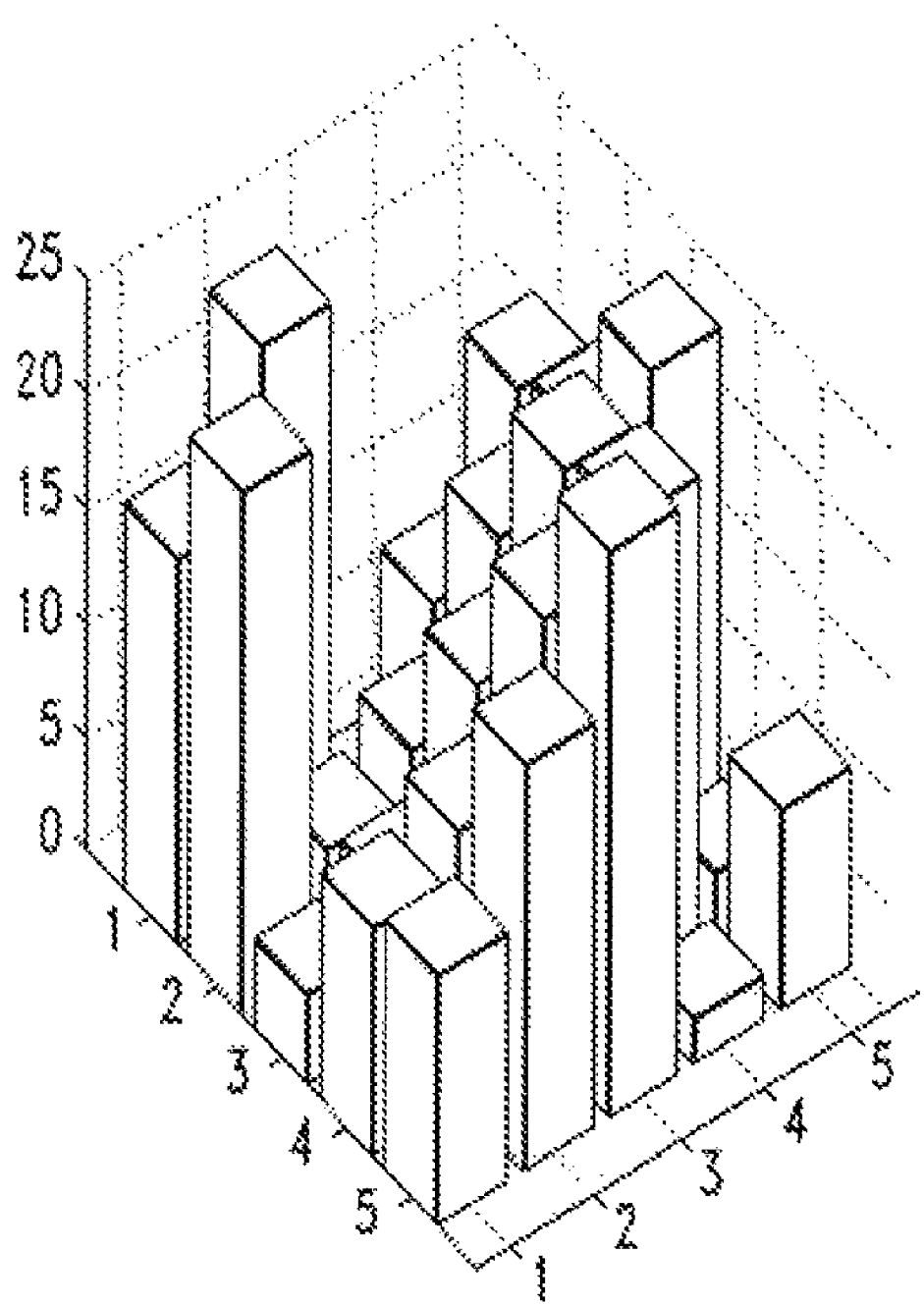
FIG. 1 shows a map of sheet resistance non-uniformity within a single semiconductor wafer using traditional lithographic and planarization techniques.
Figure 2A:
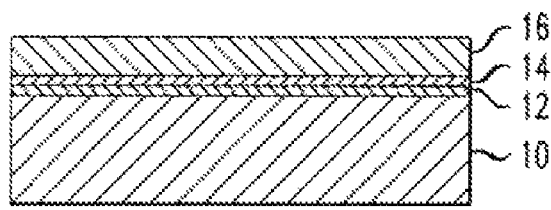
FIGS. 2A-2D are cross-section views of the buildup of a typical semiconductor structure including a copper trench.
Figure 2B:
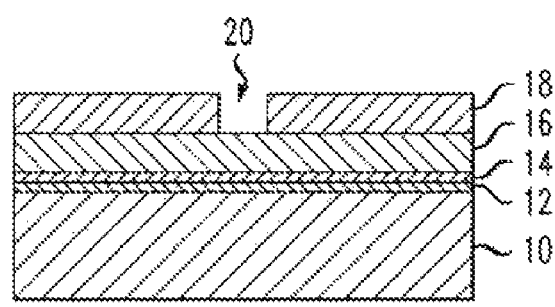
Figure 2C:
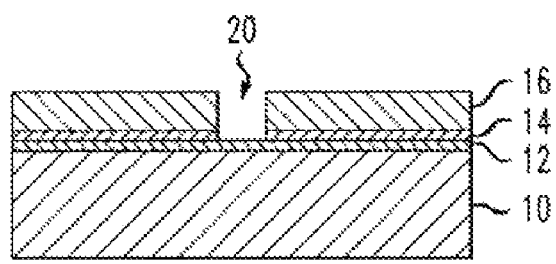
Figure 2D:
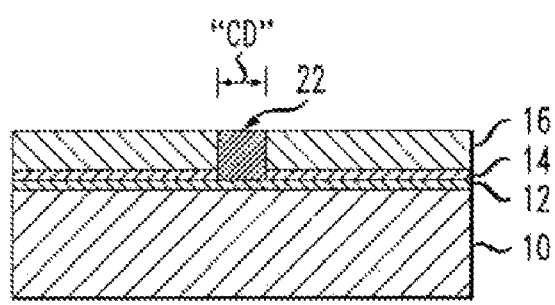

Referring to FIGS. 2A-2D an exemplary semiconductor layer structure is shown, in which a substrate 10 is provided with a planar metal layer 12. An etch stop layer 14 may then be formed over the metal layer, followed by a dielectric layer 16. As shown in FIG. 2B, trench 18 may then be formed by a conventional technique that may include patterning a photoresist layer 18 on the dielectric layer 16. The patterned photoresist layer 18 is then used as a mask to transfer the pattern (in this case a trench) through the dielectric layer 16 and etch stop layer 14 with one or more plasma etch processes to form a trench 20 through the dielectric and etch stop layers, exposing the metal layer 12 (FIG. 2C).

The trench 20 may then be filled with copper or other conductive material to form the desired conductive trench 22. The copper may be deposited by an electroless plating or electroplating process known to those skilled in the art but may also be formed by a physical vapor deposition (PVD) or atomic layer deposition (ALD) process. The conductive trench 22 may not necessarily have a planar upper surface after deposition, and thus one or more CMP steps may be used to planarize the top surface of the trench 22 and dielectric layer 16. The resulting conductive trench 22 may have a critical dimension shown as "CD."

It will be understood that multiple other trenches (not shown) will also be formed in the dielectric layer 16 during the same patterning and etch sequence. The other trenches may be arranged in patterns that range from isolated trenches to densely formed trenches.

As part of the fabrication process, one or more inspection and/or metrology steps may be undertaken to ensure that resulting structures remain within desired tolerances. Thus, after-develop inspection (ADI) techniques can be implemented to ensure that the dimensions of the patterned photoresist layer 18 remain within tolerance, while after-etch inspection (AEI) techniques may be used to ensure that the post-etch dimensions of various structures are within tolerances.

Figure 3:
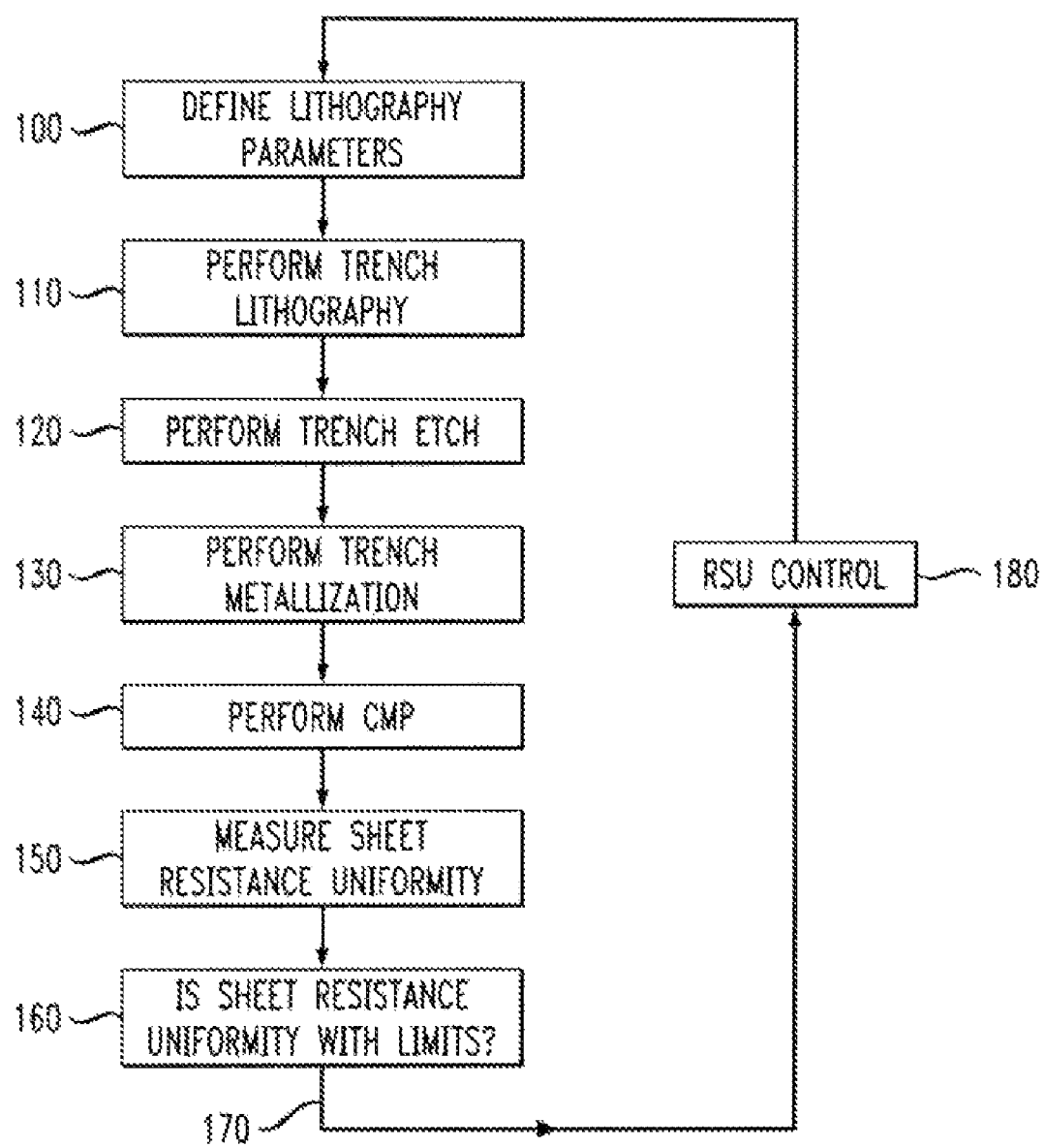
FIG. 3 is a flow chart illustrating the disclosed method.

Referring now to FIG. 3, the general steps of the disclosed method will be described. At step 100, lithography parameters are defined. This may include defining the specific shapes and dimensions of the patterned photoresist layer 18 that will be used to form trench 18. At step 110, trench lithography is performed, which may include pattern transfer and development of the photoresist layer 18. At step 120, the trench 20 may be formed through the dielectric layer 16 and the etch stop layer 14 using photoresist one or more anisotropic etch steps. As will be appreciated, only the portion of the dielectric layer and the etch stop layer left unprotected by the photoresist layer 18 will be etched.

At step 130, metal may be deposited in the trench 20 using electroplating or other appropriate technique. Overfilling of the trench 20 typically occurs, and the overfill may be removed at step 140 using one or more CMP processes. CMP planarizes the top of the conductive trench 22 and the surrounding dielectric layer 16. After the CMP step, a metrology step 150 is performed to measure the sheet resistance of the conductive trench 22. It will be appreciated that this metrology step 160 will be performed at a number of different locations on the semiconductor wafer (substrate 10) to result in a multiplicity of sheet resistance measurements. This step may be performed as part of a larger Wafer Acceptance Testing (WAT) procedure.

Often these measurement locations correspond to specific test sites disposed at different locations about the wafer. These test sites include the same or similar circuitry (e.g., trenches) used to form the actual devices formed throughout the wafer. Due to this identicality, the results from metrology performed on the test sites may be extrapolated to the rest of the devices on the wafer, to allow the machine or the user to determine whether the devices meet minimum acceptability criteria. The test sites may be positioned at any location about the wafer as desired. Often they are positioned about the periphery of the wafer.

In one embodiment, the critical dimensions "CD" of each of the conductive trenches 22 located on each of the test sites are determined by thin film metrology, metal metrology, SEM, or with an optical measurement. These techniques are known to those skilled in the art and thus will not be described herein.

At step 160, the sheet resistance measurements from the different test locations are compared with each other to obtain a map of conductive trench sheet resistance uniformity within the wafer. Based on the sheet resistivity uniformity map, a uniformity profile for the wafer run may be predicted.

At step 170, the sheet resistivity uniformity is compared to acceptable non-uniformity limits. If sheet resistance uniformity is within the prescribed limits, then the next wafer processed will be patterned, etched, metallized and planarized using the same recipe as was used for the present wafer. If, however, sheet resistance uniformity is not within the prescribed limits, then the results may be fed back to a controller at step 180 to adjust the lithography process to control the sheet resistance uniformity for the next wafer.

In one embodiment, the control step 180 includes adjusting the lithography ADI extension exposure energy to adjust the critical dimension "CD" of the trenches formed during the processing of subsequent wafers. For example, a high sheet resistance measurement may correspond to a smaller than desired cross-section ("CD") of the conductive trench 22. The correspondence between sheet resistance and "CD" may be determined using, for example, the following physical relationship between sheet resistance and trench cross sectional area:

$$CuRS \sim (W \times Hcu)^{-1}, \text{ where}$$

RS=sheet resistance
W=trench width
Hcu=copper thickness

Thus, the conversion from sheet resistance to trench cross-section may be performed, and then that information may be used to adjust the ADI extension exposure energy to increase the "CD" of the conductive trenches 22 slightly for the subsequent wafer to place them within the desired range. Likewise, low sheet resistance may correspond to a larger than desired "CD" for trench 22. Again, the ADI extension exposure energy may be adjusted to compensate in the next subsequent wafer.

Figure 4:
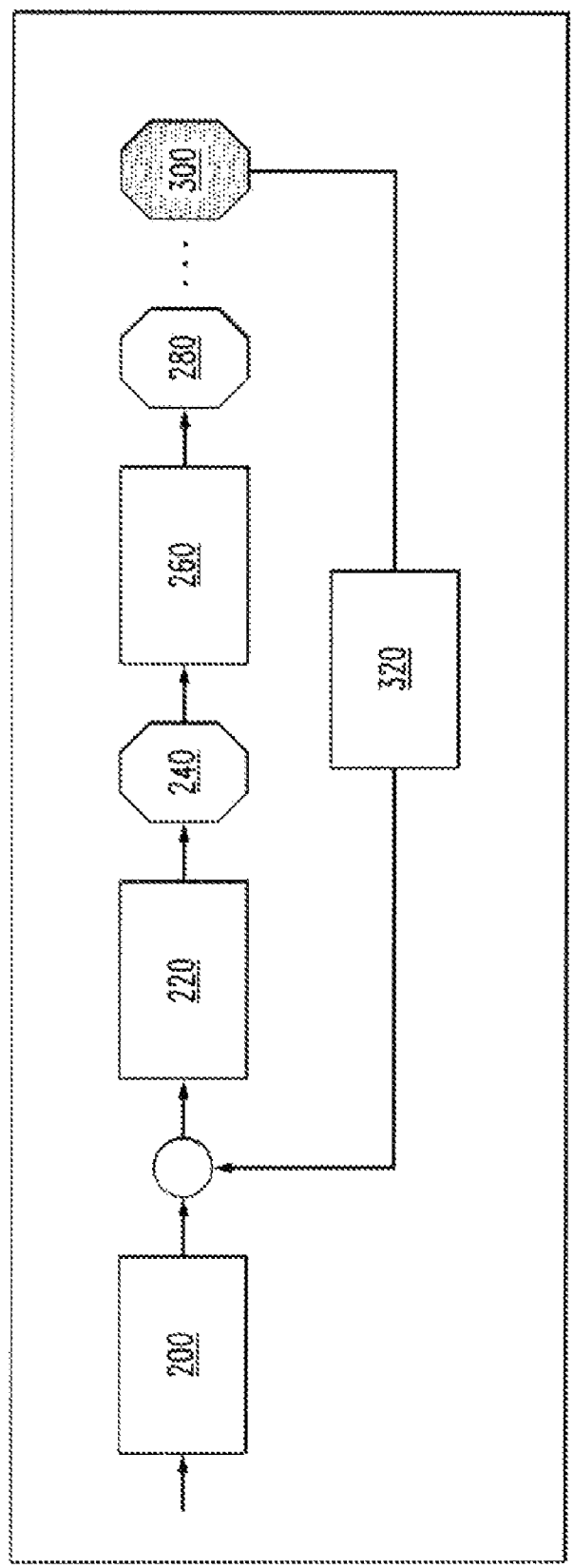
FIG. 4 is a flow chart further illustrating the disclosed method.

The measurement and control process is described in more detail in reference to FIG. 4. In general, where measured sheet resistance uniformity is higher than desired (again, corresponding to a smaller than desired "CD"), then the lithography ADI extension exposure energy will be increased accordingly. Conversely, where measured sheet resistance uniformity is lower than desired (corresponding to a larger than desired "CD"), the lithography ADI extension exposure energy is decreased accordingly.

Thus, in FIG. 4, at step 200 the RS (sheet resistance) Controller may set an initial ADI exposure energy for forming a desired trench mask. Trench lithography may be performed at step 220, followed by After Develop Inspection (ADI) 240 to verify the dimensions of the applied photoresist trench mask. If the mask dimensions are within tolerance, trench etching is performed at step 260, followed by After Etch Inspection (AEI) at 280. Metallization and CMP steps (not shown) may then be performed as previously described.

At step 300, a sheet resistance uniformity may be determined. In one embodiment, a measurement is made of the individual sheet resistance values for each of the conductive trenches 22 associated with the plurality of test locations. These individual measurements can be performed using any of a variety of acceptable metrology techniques, as previously described. The individual measurements may then be used by the Rsu Controller at step 320 to create a sheet resistance uniformity map that identifies the mean sheet resistance of a wafer, a sheet resistance deviation for each measured test site on the wafer, and a sheet resistance range for the wafer. Based on this uniformity map, a uniformity profile for the next wafer run can be predicted, and an optimum ADI recipe can be generated for controlling final sheet resistance uniformity of the conductive trenches 22 throughout the next processed wafer. That is, exposure energy may be adjusted to adjust, as appropriate, ADI. This adjustment may be achieved by applying the following control rules:

If $Rsi/RS > 1.0$, then the ADI Set Point=Previous ADI Extension Exposure Energy Set Point+1 nanometer (nm), If $Rsi/RS < 1.0$ then the ADI Set Point=Previous ADI Extension Exposure Energy Set Point−1 nm; where ADI Set Point=the original ADI target value;
Rsi=measured sheet resistance, and
RS=wafer mean sheet resistance.

In this manner, the lithography extension exposure energy can be adjusted to obtain a desired uniformity in sheet resistance across the entire wafer. It will be appreciated that since the method adjusts exposure energy by a small amount at a time, it may require more than one iteration to achieve a desired uniformity level throughout a wafer.

Figure 5B:
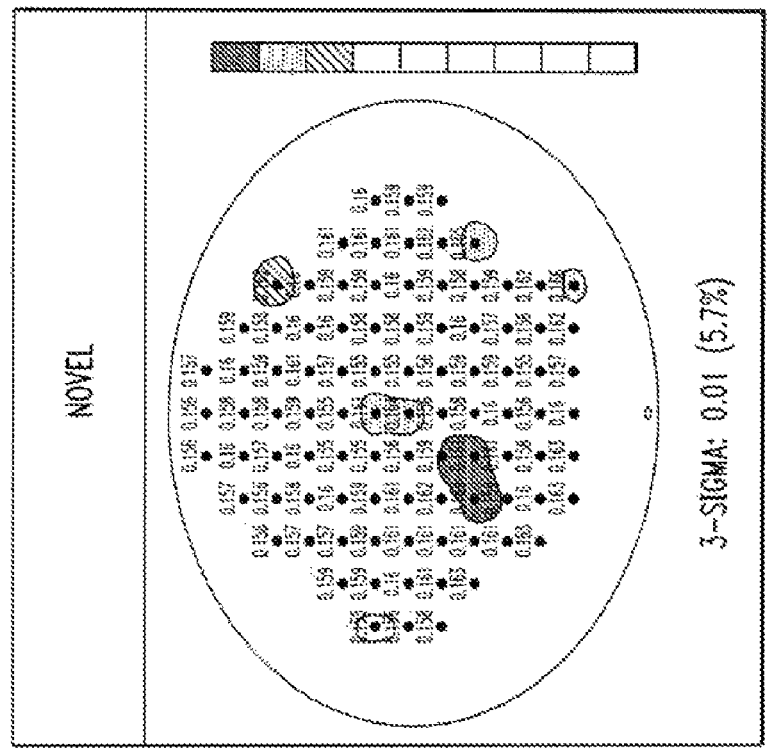
FIGS. 5A and 5B are sheet resistance uniformity maps showing, respectively, a wafer without adjusting the lithography extension exposure energy, and a wafer in which the lithography extension exposure energy was adjusted using the disclosed method.
Figure 5A:
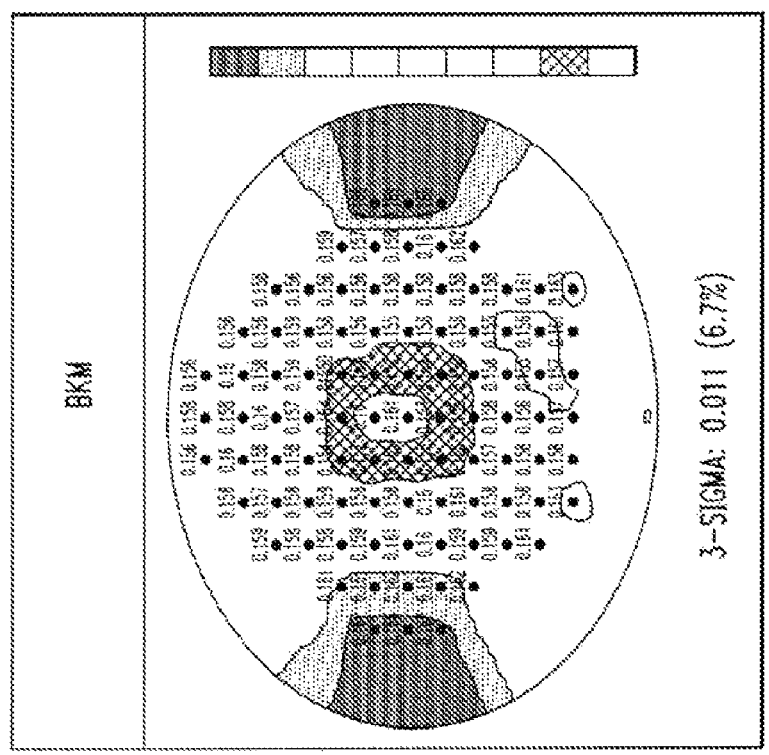
Figure 6:
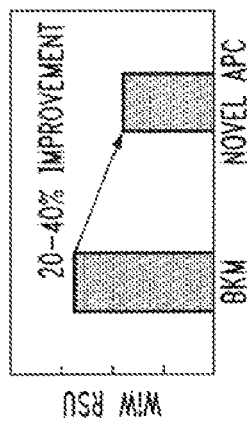
FIG. 6 is a graph comparing the improvement in sheet resistance uniformity obtained using the disclosed method.

Referring to FIGS. 5A and 5B, a pair of sheet resistance uniformity maps are shown. The map of FIG. 5A shows sheet resistance values of a single wafer to which the disclosed method has not been applied (i.e., the current Best Known Method "BKM"). The map of FIG. 5B shows sheet resistance values for a wafer to which the disclosed method has been applied (namely, for which lithography has been performed using adjusted extension exposure energy). As can be seen, the 3-sigma limit is lower for the FIG. 5B wafer as compared to the FIG. 5A wafer. FIG. 6 shows a graph illustrating the improvement of within-wafer sheet resistance uniformity obtained by using the disclosed method as compared to prior techniques ("BKM"—best known method).

Figure 7:
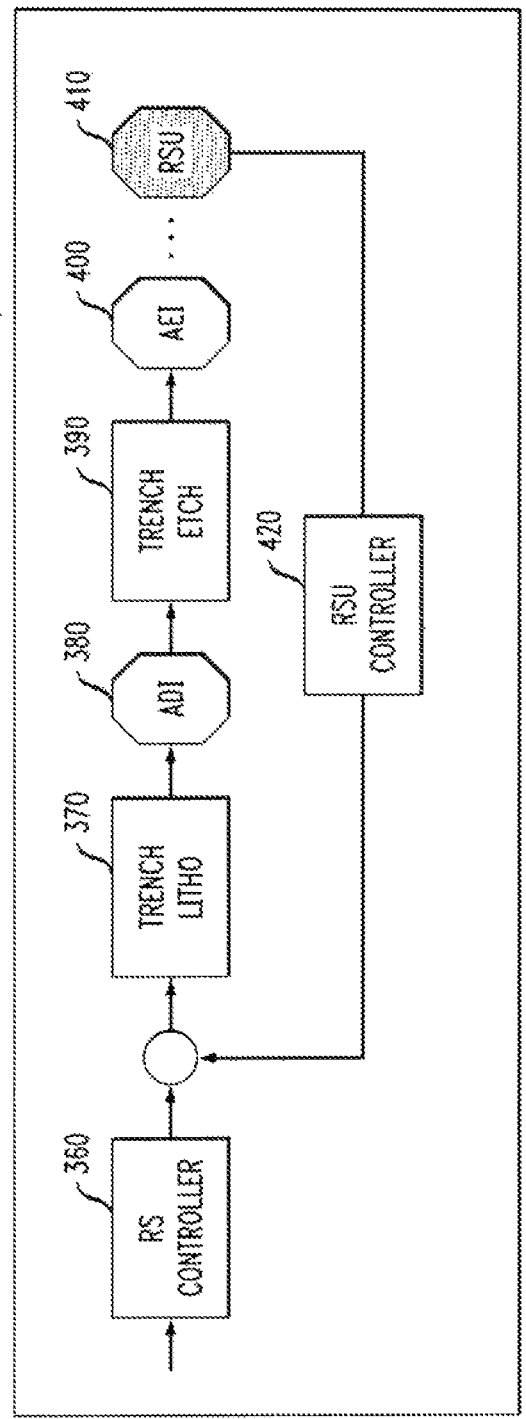
FIG. 7 illustrates a system for controlling sheet resistance uniformity of copper trenches.

Referring to FIG. 7, a system 340 is shown for enhanced control of sheet resistance uniformity in copper trench lines in semiconductor devices. An Rs controller 360 is provided for setting an initial ADI exposure energy for forming a desired trench mask on a wafer. The Rs controller 360 may be in communication with the lithography unit 370 to form the mask according to the instructions from the Rs controller. The lithography unit 370 may include an After Develop Inspection (ADI) functionality, or a separate ADI unit 380 may be provided. An etching chamber 390 may be provided for performing the trench etching, followed by an inspection station 400 for performing After Etching Inspection (AEI). Known metallization and CMP equipment (not shown) may be provided after the AEI station to perform metallization and planarization of the etched trenches. A sheet resistance measurement station 410 may then be provided to measure sheet resistance for each of the metallized trenches at the plurality of test locations on the wafer as previously described. Any of a variety of known metrology devices can be used at this station. The individual measurements may then be fed to the Rsu Controller 420. The Rsu Controller 420 may have computing capacity to create a sheet resistance uniformity map from the data received from the sheet resistance measurement station 410. The uniformity map may identify the mean sheet resistance of a wafer, a sheet resistance deviation for each measured test site on the wafer, and a sheet resistance range for the wafer. Based on this uniformity map, a uniformity profile for the next wafer run can be predicted, and an optimum ADI recipe can be generated for controlling final sheet resistance uniformity of the conductive trenches throughout the next processed wafer. Thus, the Rsu Controller may be connected to the Rs controller 360 to adjust exposure energy for lithographic processes performed on subsequent wafers to ensure that the trench dimensions (and thus sheet resistance) is maintained within a desired range.

The method described herein may be automated by, for example, tangibly embodying a program of instructions upon a computer readable storage media, capable of being read by machine capable of executing the instructions. A general purpose computer is one example of such a machine. Examples of appropriate storage media are well known in the art and would include such devices as a readable or writeable CD, flash memory chips (e.g., thumb drive), various magnetic storage media, and the like.

While the foregoing invention has been described with reference to the above embodiments, various modifications and changes can be made without departing from the spirit of the invention. Accordingly, all such modifications and changes are considered to be within the scope and range of equivalents of the appended claims.

The invention claimed is:

1. A method of controlling uniformity of sheet resistance of a conductive material trench, comprising the steps of:
   providing a first semiconductor wafer having a first structure disposed thereon;
   performing a first photolithography step to dispose a pattern on an upper surface of said first structure;
   performing a first etching step to form a first trench in the first structure;
   depositing a first layer of conductive material within the first trench to form a first conductive material trench;
   measuring a sheet resistance of the first conductive material trench;
   comparing the sheet resistance of the first conductive material trench to a predetermined sheet resistance value to obtain a first comparison value;
   providing a second semiconductor wafer having a second structure disposed thereon; and
   performing a second photolithography step to dispose a pattern on an upper surface of said second structure;
   wherein the second photolithography step comprises adjusting an extension exposure energy value for said second photolithography step based on said first comparison value according to the following formula:

if $Rsi/RS>1.0$, then a lithography extension exposure energy set point is increased, and if $Rsi/RS<1.0$ then the lithography extension exposure energy set point is decreased;

where Rsi=a measured sheet resistance, and RS=wafer mean sheet resistance.

2. The method of claim 1, wherein if $Rsi/RS>1.0$, then a lithography extension exposure energy set point=first lithography extension exposure energy set point+1 nm, and if $Rsi/RS<1.0$ then the lithography extension exposure energy set point=first lithography extension exposure energy set point−1 nm.

3. The method of claim 2, wherein the conductive material comprises copper.

4. The method of claim 1, and wherein the steps of performing a first photolithography step and performing a first etching step comprise forming a plurality of trenches in the first structure, the method further comprising depositing a first layer of conductive material within the plurality of trenches to form a plurality of first conductive material trenches;
   measuring a sheet resistance of each of the plurality of conductive material trenches;
   comparing the measured sheet resistance values for each of the plurality of conductive material trenches to a predetermined sheet resistance value to obtain a first sheet resistance uniformity map; and
   wherein the second photolithography step comprises adjusting an extension exposure energy value for said second photolithography step based on said first sheet resistance uniformity map.

5. The method of claim 4, wherein the conductive material is copper, and wherein a CMP step is performed between said depositing step and said measuring step.

6. The method of claim 5, wherein the plurality of first conductive material trenches comprise test sites located on a periphery of the first semiconductor.

7. The method of claim 1, further comprising performing a second etching step to form a second trench in the second structure;
   depositing a second layer of conductive material within the second trench to form a second conductive material trench;
   measuring a sheet resistance of the second conductive material trench;
   comparing the sheet resistance of the second conductive material trench to a predetermined sheet resistance value to obtain a second comparison value;
   providing a third semiconductor wafer having a third structure disposed thereon;
   performing a third photolithography step to dispose a pattern on an upper surface of said third structure;
   wherein the third photolithography step comprises adjusting an extension exposure energy value for said third photolithography step based on said second comparison value.

8. The method of claim 7, wherein the step of adjusting an extension exposure energy value for said third photolithography steps is performed according to the following formula:

if $Rsi/RS>1.0$, then a lithography extension exposure energy set point is increased, and if $Rsi/RS<1.0$ then the lithography extension exposure energy set point is decreased.

9. A method of controlling sheet resistance uniformity in a copper filled trench, comprising the steps of:
   providing a plurality of copper filled trenches on a first wafer;
   measuring individual sheet resistance of each of the plurality of copper filled trenches;
   comparing the individual sheet resistance measurements to a predetermined sheet resistance value to obtain a sheet resistance uniformity map of the first wafer;
   providing a second semiconductor wafer having a dielectric layer disposed thereon;
   performing a photolithography step to dispose a pattern on an upper surface of said dielectric layer;
   wherein the photolithography step comprises adjusting an extension exposure energy value for the photolithography step based on said sheet resistance uniformity map of the first wafer according to the following formula:

if $Rsi/RS>1.0$, then a lithography extension exposure energy set point=first lithography extension exposure energy set point+a first distance, and if $Rsi/RS<1.0$ then the lithography extension exposure energy set point=first lithography extension exposure energy set point−a second distance;

where Rsi=a measured sheet resistance, and RS=wafer mean sheet resistance.

10. The method of claim 9, wherein the first and second distances are 1 nm.

11. The method of claim 10, wherein the step of providing a plurality of copper filled trenches comprises patterning a dielectric layer, etching a plurality of trenches according to the patterning, filling the plurality of trenches using a copper electroplating technique, and performing a CMP step to planarize a top surface of the copper filled trenches.

12. The method of claim 9, further comprising performing a second etching step to form a plurality of second trenches in the dielectric layer formed on said second wafer;

depositing a second layer of conductive material within the plurality of second trenches to form a plurality of second conductive material trenches;

measuring a sheet resistance of each of the plurality of second conductive material trenches;

comparing the individual sheet resistance measurements of the plurality of second conductive material trenches to a predetermined sheet resistance value to obtain a sheet resistance uniformity map of the second wafer providing a third wafer having a dielectric layer disposed thereon; and performing a third photolithography step to dispose a pattern on an upper surface of said dielectric layer on said third wafer;

wherein the third photolithography step comprises adjusting an extension exposure energy value for said third photolithography step based on sheet resistance uniformity map of the second wafer.

13. The method of claim 12, wherein the steps of adjusting an extension exposure energy value for the third photolithography steps is performed according to the following formula:

if $Rsi/RS > 1.0$, then a lithography extension exposure energy set point is increased, and if $Rsi/RS < 1.0$ then the lithography extension exposure energy set point is decreased.

14. The method of claim 12, wherein the first and second plurality of conductive material trenches comprise test sites located about a periphery of the first and second wafers, respectively.

* * * * *